United States Patent
Pellat et al.

(10) Patent No.: US 7,280,815 B2
(45) Date of Patent: Oct. 9, 2007

(54) PROCESS FOR CONTROL OF STANDBY CURRENTS IN A DIRECT CONVERSION TYPE OF FREQUENCY TRANSPOSITION DEVICE, AND CORRESPONDING DEVICE

(75) Inventors: Bruno Pellat, La Terrasse (FR); Sylvie Gellida, Grenoble (FR); Jean-Charles Grasset, Moirans (FR); Frédéric Rivoirard, Fontaine (FR)

(73) Assignee: STMicroelectronics S.A., Montrouge (FR)

( * ) Notice: Subject to any disclaimer, the term of this patent is extended or adjusted under 35 U.S.C. 154(b) by 475 days.

(21) Appl. No.: 10/649,345

(22) Filed: Aug. 27, 2003

(65) Prior Publication Data

US 2004/0085101 A1 May 6, 2004

(30) Foreign Application Priority Data

Aug. 28, 2002 (FR) .................................. 0210647

(51) Int. Cl.
*H04B 1/26* (2006.01)
(52) U.S. Cl. ...................... 455/326; 455/324; 455/333; 327/355
(58) Field of Classification Search ................ 455/324, 455/333, 334, 326; 327/359, 355; 330/258
See application file for complete search history.

(56) References Cited

U.S. PATENT DOCUMENTS

| 5,532,637 | A |   | 7/1996  | Khoury et al.          |
|-----------|---|---|---------|------------------------|
| 5,548,840 | A | * | 8/1996  | Heck ............ 455/326 |
| 5,587,682 | A | * | 12/1996 | Colli et al. ...... 327/357 |
| 5,613,233 | A |   | 3/1997  | Vagher                 |
| 5,886,547 | A |   | 3/1999  | Durec et al.           |
| 6,021,323 | A | * | 2/2000  | Vagher .......... 455/324 |
| 6,023,196 | A |   | 2/2000  | Ashby et al.           |
| 6,037,825 | A | * | 3/2000  | Kung ............ 327/359 |
| 6,819,914 | B2 | * | 11/2004 | Yan et al. ........ 455/318 |
| 6,922,556 | B2 | * | 7/2005  | Beumer .......... 455/333 |

OTHER PUBLICATIONS

French Search Report, FR 0210647, dated Feb. 12, 2003.

* cited by examiner

*Primary Examiner*—Edward F. Urban
*Assistant Examiner*—Adeel Haroon
(74) *Attorney, Agent, or Firm*—Gardere Wynne Sewell LLP

(57) ABSTRACT

A direct conversion type of frequency transposition device includes a transconductor block receiving the input signal and a current switching block connected to the output from the device. At least the common mode $(I_{if1}+I_{if2})$ is servo-controlled to static output currents from the frequency transposition device on a current proportional to a reference current $(I_{ref})$ and independent of the static output currents from the transconductor block.

38 Claims, 4 Drawing Sheets

PROCESS FOR CONTROL OF STANDBY CURRENTS IN A DIRECT CONVERSION TYPE OF FREQUENCY TRANSPOSITION DEVICE, AND CORRESPONDING DEVICE

PRIORITY CLAIM

The present application claims priority from French Application for Patent No. 02 10647, filed Aug. 28, 2002, the disclosure of which is hereby incorporated by reference.

BACKGROUND OF THE INVENTION

1. Technical Field of the Invention

The invention relates to frequency transposition and is advantageously applicable, without limitation, in the radio frequency domain, for example in mobile telephony, in which radio frequency circuits frequently use frequency transposition devices, or frequency mixers, both for transmission and for reception.

2. Description of Related Art

For transmission, frequency mixers, that are actually frequency step up circuits, are designed to transpose base band information around the transmission carrier. For reception, frequency mixers are frequency step down assemblies.

Existing radio frequency receivers are based on a direct conversion architecture. In other words, with this type of architecture, the input signal is directly converted into base band without the need for any intermediate transposition. This type of architecture has indisputable advantages, particularly the lack of any external intermediate frequency filters.

However, there are several disadvantages that complicate the design of this type of receiver. One of these disadvantages is due to the fact that the mixer output signal band comprises low frequencies close to zero, in other words close to direct current. The result is then that the mixer has its own output voltage offset that forms an interference signal for the useful signal. Furthermore, amplification means with a global gain of a few tens of dB are generally interposed between the mixer and the analog to digital conversion stage. The result is that the voltage offset of the mixer can saturate the analog to digital conversion stage.

Furthermore, the radio frequency part of a mixer must have a high gain, good linearity and low standby current. In order to achieve these performances, means of polarizing this radio frequency stage are usually used such that the standby current varies with the input signal making the circuit more linear for a given standby current. Furthermore, in order to guarantee stable temperature performances, the means of polarizing the radio frequency stage of the mixer usually use currents proportional to the absolute temperature (PTAT currents). Thus, standby currents in the radio frequency stage of the mixer vary with the power of the input signal and with the temperature.

However, in particular, these variations in the standby currents at the radio frequency stage are the cause of a variation of the mixer output offset voltage, and consequently may make it more difficult to satisfy the specifications on this mixer output offset voltage.

There is accordingly a need for a solution to this problem. Such a solution should preferably avoid any variation to the mixer output offset voltage, particularly when standby currents of the radio frequency stage vary with the input signal and with the temperature.

SUMMARY OF THE INVENTION

The present invention proposes a process for controlling static (or standby) currents of a frequency transposition device of the direct conversion type that includes a transconductor block into which the input signal is applied and a current switching block connected to the output from the device.

According to one general characteristic of the invention, at least the common mode is servocontrolled to static output currents from the frequency transposition device on a current proportional to a reference current and independent of the static output currents from the transconductor block.

In other words, according to the invention, standby currents of the current switching stage and of the radio frequency stage are controlled independently.

According to one variant of the invention, only the common mode of the static output currents are servocontrolled. This servocontrol may be done directly or indirectly.

In the case of an indirect servocontrol, the common mode of input currents to the current switching block is servocontrolled to a current proportional to the reference current and is independent of static output currents from the transconductor block.

Furthermore, in this type of variant, the difference between the input currents to the current switching block can be servocontrolled to zero by making a differential check of the static output currents from the transconductor block.

In another variant of the invention, the common mode of static output currents from the frequency transposition device can be servocontrolled directly to the current proportional to the reference current and independent of static output currents from the transconductor block.

Once again, in this variant, the difference between the static output currents from the frequency transposition device can be servocontrolled to zero by making a differential check of the static output currents from the transconductor block.

According to another variant of the invention, the common mode of the static output currents can be servocontrolled not only to the current proportional to the reference current, but each of the static output currents can also be servocontrolled to a current proportional to the reference current and independent of the static output currents from the transconductor block. Once again, this servocontrol can be made indirectly, in other words by servocontrolling each input current to the current switching block to a current proportional to the reference current and independent of the static output currents from the transconductor block.

Another aspect of the invention is a frequency transposition device of the direct conversion type, comprising a transconductor block receiving the input signal and a current switching block connected to the output from the device.

According to one general characteristic of the invention, the device includes servocontrol means capable of servocontrolling at least the common mode of static output currents from the frequency transposition device to a current proportional to a reference current independent of the static output currents from the transconductor block.

According to one embodiment of the invention, the servocontrol means are capable of servocontrolling the common mode of current switching block input currents to a current proportional to the reference current and independent of static output currents from the transconductor block.

In this embodiment, the servocontrol means can comprise a current source generating the said reference current on its output terminal connected to the two inputs to the current switching block, and a single current amplifier that has a first input connected to the output terminal from the current source, a second input connected to the two inputs to the current switching block and to the two outputs from the transconductor block, and an output connected to the two outputs from the transconductor block.

The device may also comprise a differential current amplifier connected between the two outputs from the transconductor block and means of polarizing this transconductor block, so as to servocontrol the difference between input currents to the current switching block to zero by making a differential control of the static output currents from the transconductor block.

According to another embodiment of the invention, the servocontrol means are capable of directly servocontrolling the common mode of static output currents from the frequency transposition device on the said current proportional to the reference current and independent of the static output currents from the transconductor block.

In this embodiment, the servocontrol means can include a current source generating the said reference current on its output terminal connected to the two inputs to the current switching block, and a single current amplifier with a first input connected to the output terminal from the current source, a second input connected to the two outputs from the current switching block and an output connected to the two outputs from the transconductor block.

The device may also comprise a differential current amplifier connected between the two outputs from the transconductor block and means of polarizing this transconductor block, so as to servocontrol the static output currents from the frequency transposition device to zero by making a differential control of static output currents from the transconductor block.

According to another embodiment of the invention, the servocontrol means can also servocontrol each input current in the current switching block to a current proportional to the reference current and independent of the static output currents from the transconductor block.

In this embodiment, the servocontrol means could comprise:

a current source generating the said reference current on its output terminal connected to the two inputs of the current switching block, a first current amplifier provided with a first input connected to the output terminal from the current source, an output connected to a first input to the current switching block and a first output from the transconductor block, and looped back to a second input of the first amplifier, and a second current amplifier with a first input connected to the output terminal of the current source, an output connected to a second input of the current switching block and to a second output from the transconductor block and looped back to a second input of the second amplifier.

The device according to the invention is advantageously made in the form of an integrated circuit.

The invention also covers a terminal of a wireless communication system, for example a mobile cell phone, incorporating a frequency transposition device like that defined above.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
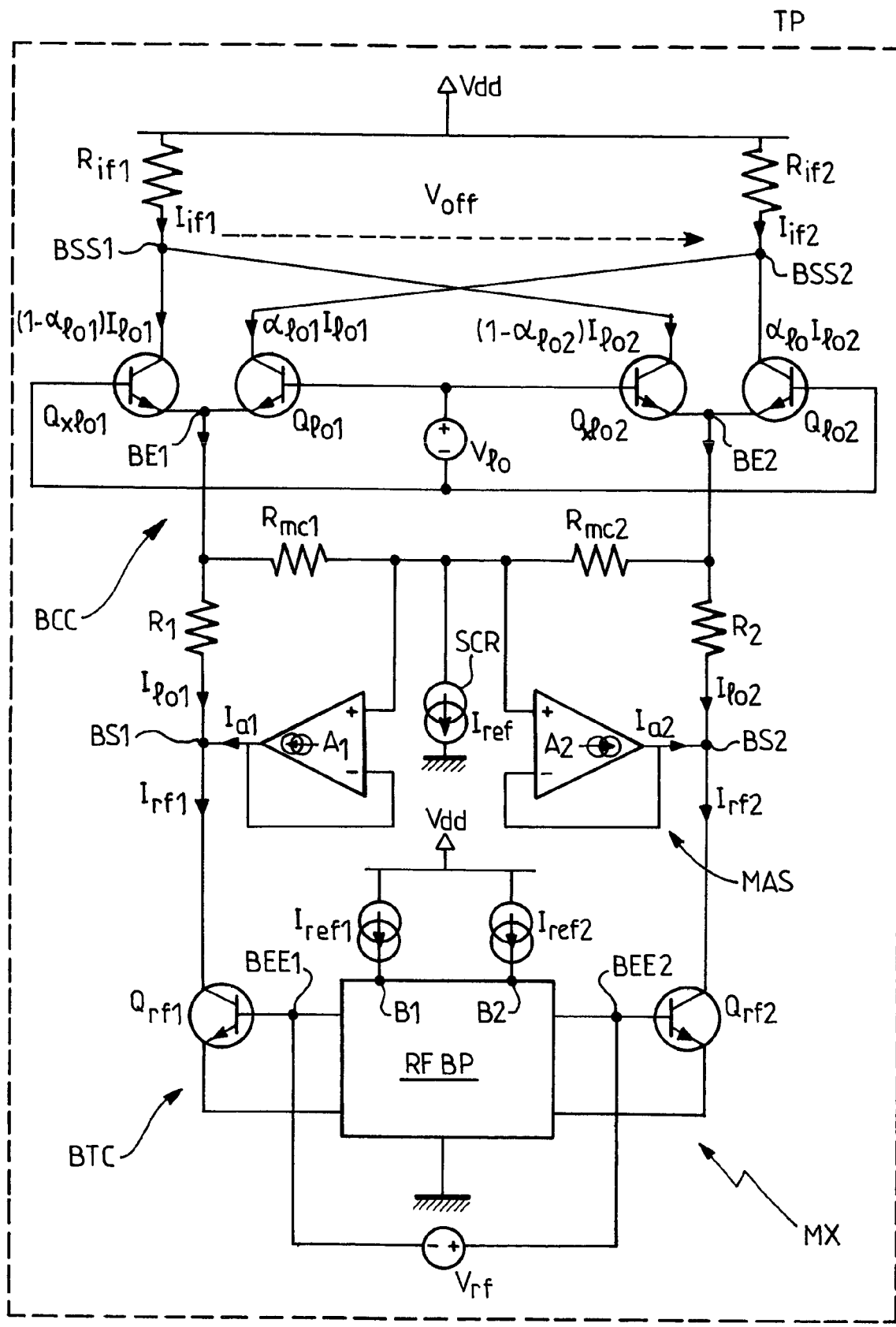
FIG. 1 diagrammatically illustrates a first embodiment of a device according to the invention enabling a first use of the process according to the invention.

In FIG. 1, the reference MX denotes a direct conversion type of frequency transposition device or mixer.

For example, this mixer MX may be incorporated in the analog stage of the radio frequency reception chain of a mobile cell phone TP.

This mixer MX has an input terminal (in this case two terminals BEE1 and BEE2 since it is a differential structure) to which an input signal (voltage) $V_{rf}$ is applied and an output terminal (in this case two terminals BSS1 and BSS2) to output the output signal after transposition.

Furthermore, the local oscillator signal in this case is generated by a voltage source $V_{lo}$.

The structure used for this mixer is a GILBERT differential type of structure.

More precisely, this type of structure comprises a differential transconductor block BTC to convert the input signal present on terminals BEE1 and BEE2 into a differential current.

In this case, this block BTC has a stage composed of a differential pair of transistors $Q_{rf1}$ and $Q_{rf2}$, the bases of which are connected to the two input terminals BEE1 and BEE2.

The transistors Qrf1 and Qrf2 are polarized by polarization means RFBP with a conventional structure known in itself, and in particular two currents Iref1 and Iref2 are applied to the two terminals B1 and B2.

Figure 2:
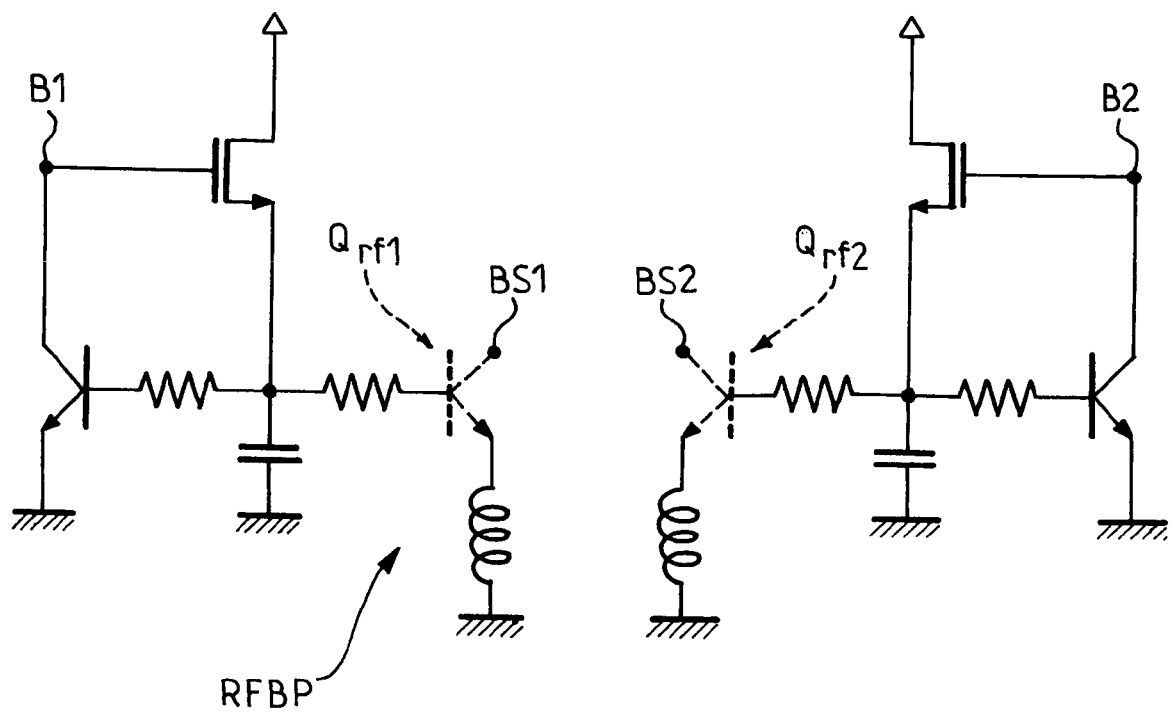
FIG. 2 illustrates an embodiment of means of polarizing the radio frequency stage of the transposition device according to the invention.

One conventional method of making the polarization means RFBP is diagrammatically illustrated in FIG. 2, and it will not be described in more detail in this presentation.

At the output from the transconductor block BTC, in other words at the collectors of transistors $Q_{rf1}$ and $Q_{rf2}$, a current switching block BCC is connected that switches the current alternately to one and then to the other output terminals BSS1 and BSS2 at the frequency of the local oscillator signal $V_{lo}$.

This block BCC conventionally comprises two pairs of transistors $Q_{xlo1}$, $Q_{lo1}$ and $Q_{xlo2}$, $Q_{lo2}$.

Each resistance $R_{if1}$ and $R_{if2}$ connected between the output terminals BSS1 and BSS2 and the power supply Vdd, represents the output load from mixer MX.

The transconductor formed particularly from transistors $Q_{rf1}$ and $Q_{rf2}$ used in this case to define the transconductance of block BTC, converts the power or voltage applied to the input BEE1 and BEE2 into a differential current which is a supposedly linear image of the input signal. This linear signal is then chopped by a non-linear square function (+1, −1, +1, −1, . . . ) made by the double switch BCC, at the frequency of the local oscillator signal, this switch acting as dynamic current switching device. The output signal is collected at the terminals of the differential load $R_{if1}+R_{if2}$.

The mixer MX also includes a current source SCR outputting a reference current $I_{ref}$. The output terminal from this current source SCR is connected firstly to a first input terminal BE1 of the current switching block BCC through a resistance $R_{mc1}$ and to a second input terminal BE2 of the current switching block BCC through another resistance $R_{mc2}$.

Two current amplifiers A1 and A2 are connected between the output terminal of the current source and the corresponding output terminals (collectors of transistors $Q_{rf1}$ and $Q_{rf2}$) BS1 and BS2 of the transconductor block BTC.

More precisely, the + input to amplifier A1 is connected to the output terminal of the current source SCR. The output from this amplifier A1 is connected to the terminal BS1 and also to terminal BE1 through a resistance R1. Furthermore, the output from amplifier A1 is looped back onto its − input.

The result of this architecture is that the input currents $I_{lo1}$ and $I_{lo2}$ to the current switching block BCC are given by formulas (I) and (II) below respectively, in the special and practical case in which $R_{mc1}=R_{mc2}=R_{mc}$ and in which the potentials of nodes BE1 and BE2 are identical (transistors in block BCC are identical).

$$I_{lo1} = \frac{R_{mc}I_{ref}}{2R_1} \quad (I)$$

$$I_{lo2} = \frac{R_{mc}I_{ref}}{2R_2} \quad (II)$$

Therefore, it can be seen that the input currents $I_{lo1}$ and $I_{lo2}$ are servocontrolled to a current proportional to the current $I_{ref}$ output by the current source SCR, independent of the static output currents $I_{rf1}$ and $R_{rf2}$ from the transconductor block BTC.

The current source SCR and the two current amplifiers A1 and A2 thus form servocontrol means MAS that will servocontrol the above mentioned currents to the current proportional to current $I_{ref}$.

In particular, even if the currents $I_{rf1}$ and $I_{rf2}$ are currents proportional to the absolute temperature (PTAT currents) or increasing with the power of the input radio frequency signal, the currents $I_{lo1}$ and $I_{lo1}$, and consequently the output currents $I_{rf1}$ and $I_{rf2}$ from the mixer MX remain constant provided that the current $I_{ref}$ remains constant.

Consequently, the offset output voltage from the mixer reference $V_{off}$ is supplied by formula (III) below:

$$V_{off} = \frac{1}{2}(R_{if1}+R_{if2})\left(\frac{R_{mc}}{2R_1}+\frac{R_{mc}}{2R_2}\right)I_{ref}\left(\frac{R_{if1}-R_{if2}}{R_{if1}+R_{if2}}\right) +$$
$$(1-(\alpha_{i01}+\alpha_{i02}))-(\alpha_{i01}-\alpha_{i02})\frac{R_{mc}R_1-R_{mc}R_2}{R_{mc}R_1+R_{mc}R_2}$$

and remains constant even if the temperature and the power of the input signal vary.

We will now illustrate a numeric example of the advantages of the invention.

In this respect, it will be assumed that the standby currents $I_{rf1}$ and $I_{rf2}$ are proportional to the absolute temperature (PTAT currents) and increase with the power of the input signal.

It is also assumed that the operating temperature range is defined from −40° C. to 100° C. The variation of a PTAT current with respect to the nominal value of 300° K. varies between −22% and +24% over the entire temperature range.

It is also assumed that the currents $I_{rf1}$ and $I_{rf2}$ increase by 20% for an input level of −23 dBm which corresponds to a imput level of a so-called blocker signal.

Finally, it is assumed that the resistances $R_{if1}$ and $R_{if2}$ are equal to the value of 650 ohms with a relative error of 1%.

The static offset $V_{off}$ is then equal to 7.8 mV with currents $I_{rf1}$ and $I_{rf2}$ equal to 1.2 mA.

With a mixer according to prior art, the output currents $I_{rf1}$ and $I_{rf2}$ vary from 0.936 mA to 1.488 mA within the temperature range, which leads to a variation of the static voltage offset $V_{off}$ equal to 3.6 mV, while the specifications require that the variation should be less than 1 mV.

At the same time, as long as there is a "blocker" present at the mixer input, the output currents increase by 240 microamperes, which leads to an increase in the offset voltage $V_{off}$ equal to 1.56 mV, while the specifications usually impose a variation of less than 100 microvolts.

However, for a mixer according to the invention, the change in temperature due to the output currents is fixed by the reference current $L_{ref}$ that can theoretically remain unchanged by the temperature, which means that it varies by less than 5% within the temperature range. Consequently, the variation of $V_{off}$ with temperature is 400 microvolts.

Concerning the variation of output currents with the power of the input signal, the input signal depends on the static gain of the servocontrol means (MAS) in an open loop. If it is assumed that there is more than 40 dB, then the output currents vary by less than 0.2% when the currents $I_{rf1}$ and $I_{rf2}$ increase by 20%. Consequently, $V_{off}$ varies by 16 microvolts.

In the variant that has just been described above, the common mode of the input currents to the current switching block and consequently the mixer output currents are servocontrolled, and each of these mixer output currents is also individually servo controlled.

Figure 3:
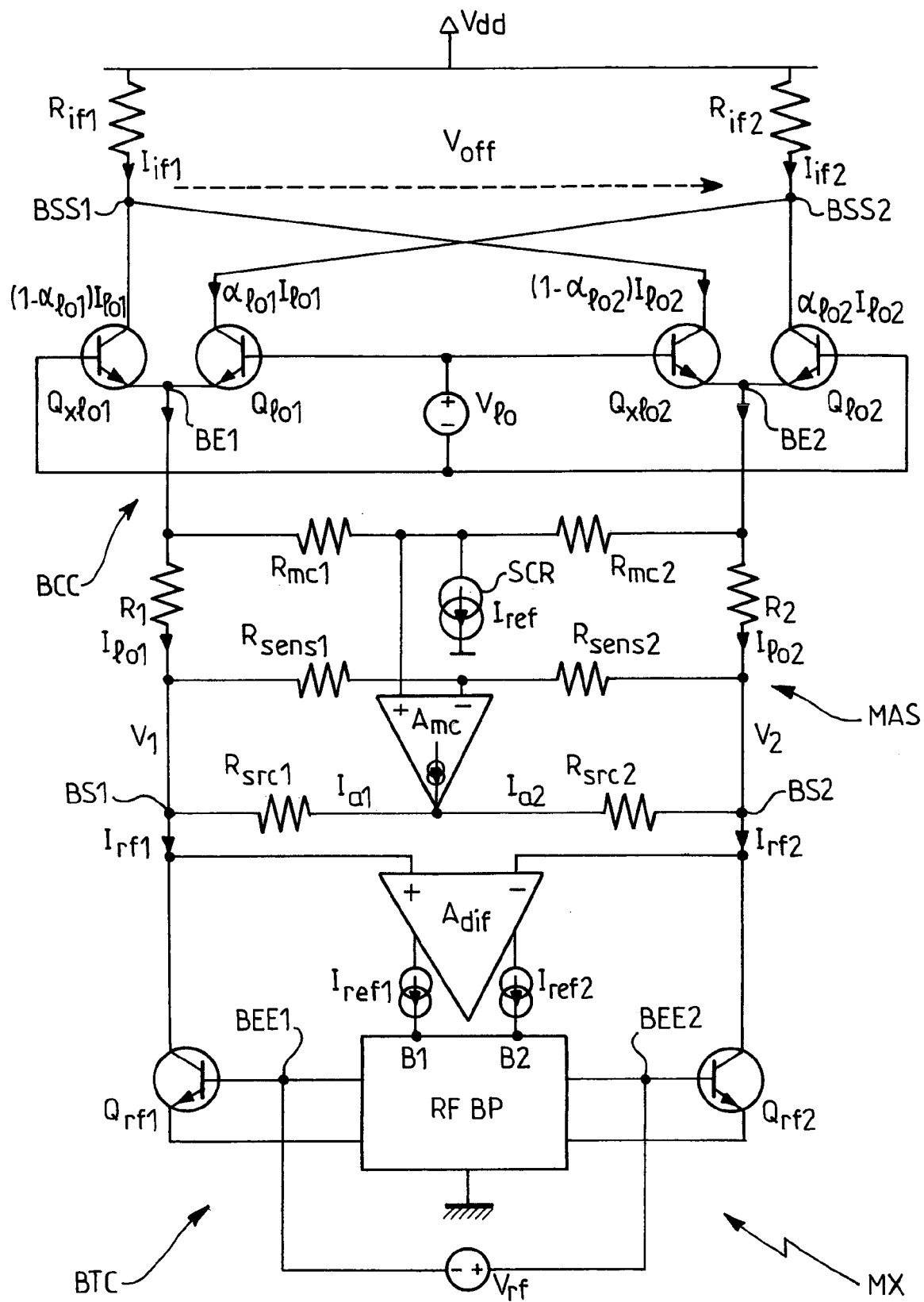
FIG. 3 diagrammatically illustrates a second embodiment of the invention, enabling a second embodiment of the process according to the invention.

In one variant illustrated in FIG. 3, the servocontrol means MAS comprise only a single current amplifier $A_{mc}$ that will servocontrol the common mode $I_{lo1}+I_{lo2}$ of input currents to the current switching block to a current proportional to the reference current $I_{ref}$ and independent of the static output currents from the transconductor block BTC.

More precisely, this single amplifier $A_{mc}$ has a + input connected to the terminal BE1 through resistance $R_{mc1}$ and to the output terminal from the reference source SCR. This + input is also connected to the input terminal BE2 through the resistance $R_{mc2}$.

The − input to the amplifier $A_{mc}$ is connected firstly to the output terminal BS1 from the transconductor block BTC through a resistance $R_{sens1}$, and to the terminal BS2 through a resistance $R_{sens2}$.

Furthermore, the output from this amplifier $A_{dif}$ is connected to two terminals BS1 and BS2 through two resistances $R_{src1}$ and $R_{src2}$.

Furthermore, a differential current amplifier $A_{mc}$ is connected between the two output terminals BS1 and BS2 and the two terminals B1 and B2 of the polarization means RFBP. This differential current amplifier $A_{dif}$ will therefore servocontrol the difference $I_{lo1}-I_{lo2}$ between the input currents to current switching block to zero by checking the difference between the reference currents $I_{ref1}$ and $I_{ref2}$ in the radio frequency stage so as to make the voltage difference $V_1-V_2$ equal to zero.

Thus, assuming that the resistances $R_1$ and $R_2$ are equal, and also that the resistances $R_{mc1}$ and $R_{mc2}$ are equal, the the common mode current of the input currents to the current switching block is given by formula (IV) below:

$$I_{lo1}+I_{lo2}=R_{mc}I_{ref}/R \qquad (IV)$$

where $R=R_1=R_2$ therefore, the result is that Voff is given by formula (V) below:

$$V_{off} = \frac{1}{2}(R_{if1}+R_{if2})R_{mc}I_{ref}\left(\frac{R_{if1}-R_{if2}}{R_{if1}+R_{if2}}+(I-(\alpha_{lo1}+\alpha_{lo2}))\right)/R$$

Therefore, it will be noted that Voff does not depend on the standby current of the radio frequency stage.

This variant has an additional advantage in the sense that as a result of the use of the amplifier $A_{dif}$, the block BTC is symmetric since $I_{rf1}$ is equal to $I_{rf2}$, which reduces the second order non-linearity of this transconductor block, which is also beneficial for variations of $V_{off}$.

Figure 4:
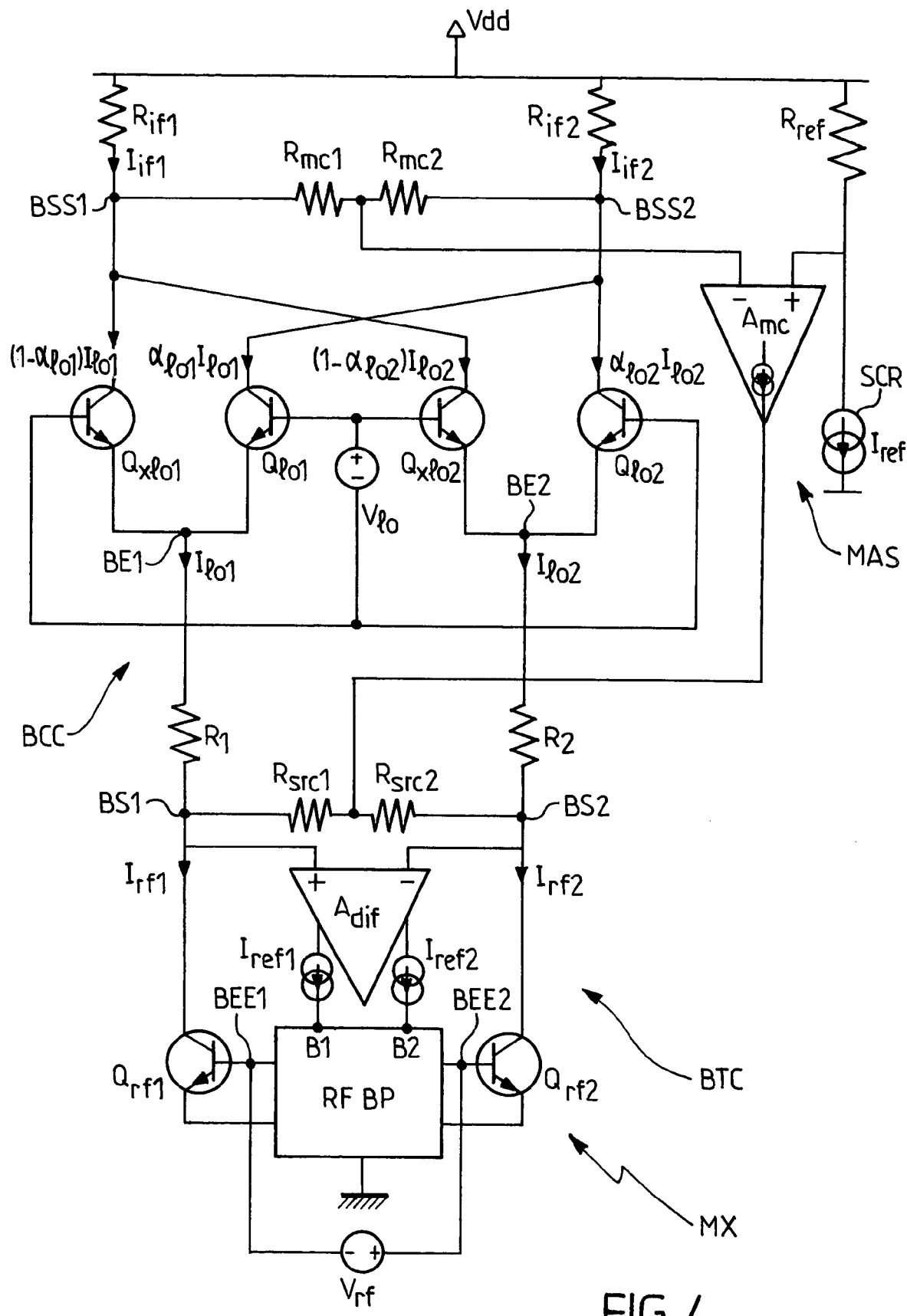
FIG. 4 diagrammatically illustrates a third embodiment of the device according to the invention, enabling a third embodiment of the process according to the invention.

Although the servocontrol means MAS in the two variants that have just been described act on the input currents $I_{lo1}$ and $I_{lo2}$ to the current switching block BCC to servocontrol the mixer output currents $I_{if1}$ and $I_{if2}$, or at least their common mode, the servocontrol means MAS of the variant illustrated in FIG. 4 directly servocontrols the $I_{if1}+I_{if2}$ common mode of output currents from the mixer MX to a current proportional to the reference current $I_{ref}$.

In this respect, in addition to the current source SCR, the servocontrol means MAS comprise a single current amplifier $A_{mc}$ with a first + input connected to the output terminal from the current source, and a second − input connected to the two outputs BSS1 and BSS2 from the current switching block through the two resistance $R_{mc1}$ and $R_{mc2}$.

Furthermore, the output from this current amplifier $A_{mc}$ is connected to two outputs BS1 and BS2 from the transconductor block BTC through the two resistances $R_{src1}$ and $R_{src2}$.

As in the variant illustrated in FIG. 3, the differential control is made by the differential amplifier $A_{dif}$.

The advantage of this variant is due to the fact that it minimizes connections on the radio frequency part.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for checking the static currents of a direct conversion type of frequency transposition device which includes a transconductor block receiving the input signal and a current switching block connected to the output from the device, comprising:
   servocontrolling at least a common mode static output current from the frequency transposition device to a current proportional to a reference current and independent of a static output current from the transconductor block.

2. The process according to claim 1, wherein the step of servocontrolling comprises servocontrolling a common mode input current to the current switching block to a current proportional to the reference current and independent of the static output current from the transconductor block.

3. The process according to claim 2, wherein the input current to the current switching block is a differential current, and wherein the static output current from the transconductor block is a differential current, further comprising:
   servocontrolling a difference between the differential input currents to the current switching block to zero by making a differential comparison of the differential static output currents from the transconductor block.

4. The process according to claim 1, wherein the step of servocontrolling comprises servocontrolling to common mode static output current from the frequency transposition device directly to the current proportional to the reference current and independent of static output current from the transconductor block.

5. The process according to claim 4, wherein the static output current from the transconductor block is a differential current, further comprising:
   servocontrolling a difference between the static output currents from the frequency transposition device to zero by making a differential comparison of the static output currents from the transconductor block.

6. The process according to claim 1, further including servocontrolling the static output current to a current proportional to the reference current and independent of the static output current from the trsnaconductor block by servocontrolling each input current to the current switching block onto a current proportional to the reference current and independent of the static output current from the transconductor block.

7. A direct conversion type of frequency transposition device, comprising:
   a transconductor block receiving an input signal;
   a current switching block connected to an output from the device; and
   a servocontroller operable to servocontrol at least a common mode of a static output current from the frequency transposition device to a current proportional to a reference current and independent of a static output current from the transconductor block.

8. The device according to claim 7, wherein the servocontroller operates to servocontrol a common mode input current to the current switching block to a current proportional to the reference current and independent of the static output current from the transconductor block.

9. The device according to claim 8, wherein the servocontroller comprises:
   a current source generating the reference current on its output terminal which is connected to a current switching block input; and
   a first differential current amplifier having a first input connected to the output terminal from the current source, a second input connected to the current switching block input and to the transconductor block output, and an output connected to the transconductor block output.

10. The device according to claim 9, the servocontroller further comprising a second differential current amplifier having inputs connected to the differential transconductor block outputs and an output connected to a means for polarizing this transconductdr block so as to servocontrol a difference between differential input currents to the current switching black to zero by making a differential control of static output currents from the transconductor block.

11. The device according to claim 8, wherein the servocontroller further operates to servocontrol each input current to the current switching block to a current proportional to the reference current and independent of the static output current front the transconductor block.

12. The device according to claim 11, wherein the servocontroller comprises:
   a current source generating the reference current on its output terminal connected to the current switching block input;
   a first differential current amplifier that has a first input connected to the output terminal from the current source, an output connected to a first input to the current switching block and to a first output from the transconductor block, and the output being looped back to a second input of the first amplifier; and
   a second differential current amplifier that has a first input connected to the output terminal from the current source, an output connected to a second input of the current switching block and to a second output from the transconductor block and the output being looped back to a second input of the second amplifier.

13. The device according to claim 7, wherein the servocontroller directly servocontrols common mode static output current from the frequency transposition device to the current proportional to the reference current and independent of the static output current from the transconductor block.

14. The device, according to claim 13, wherein the servocontroller comprises:
   a current source generating the reference current on its output terminal connected to a current switching block input; and
   a differential current amplifier having a first input connected to the output terminal from the current source, a second input connected to the current switching block output and an output connected to the transconductor block output.

15. The device according to claim 14, the servocontroller further comprising a second differential current amplifier having inputs connected to the differential transconductor block outputs and an output connected to a means for polarizing this transconductor block so as to servocontrol a difference between differential static output currents from the frequency transposition device to zero by making a differential control of static output currents from the transconductor block.

16. The device according to claim 7 as fabricated in the form of an integrated circuit.

17. A wireless communication system terminal which includes a direct conversion type of frequency transposition device, the device comprising:
   a transconductor block receiving an input signal;
   a current switching block connected to an output from the device; and
   a servocontroller operable servocontrol at least a common made of a static output current from the frequency transposition device to a current proportional to a reference current and independent of a static output current from the transconductor block.

18. The terminal according to claim 17, wherein the terminal is a mobile cell phone.

19. The terminal according to claim 18, wherein the servocontroller directly servocontrols common mode static output current from the frequency transposition device to the current proportional to the reference current and independent of the static output current from the transconductor block.

20. The terminal according to claim 19, wherein the servocontroller comprises:
   a current source generating the reference current on its output terminal connected to a current switching block input; and
   a first differential current amplifier having a first input connected to the output terminal from the current source, a second input connected to the current switching block output and an output connected to the transconductor block output.

21. The terminal according to claim 20, the servocontroller further comprising a second differential current amplifier having inputs connected to the differential transconductor block outputs and an output connected to a means for polarlaing this transconductor block so as to sarvocontrol a difference between differential static output currents from the frequency transposition device to zero by making a differential control of static output currents from the transconductor block.

22. The terminal according to claim 17, wherein the servocontroller operates to servocontrol a common mode input current to the current switching block to a current proportional to the reference current and independent of the static output current from the transconductor block.

23. The terminal according to claim 22, wherein the servocontroller comprises:
   a current source generating the reference current on its output terminal which is connected to a current switching block input; and
   a first differential current amplifier having a first input connected to the output terminal from the current source, a second input connected to the current switching block input and to the transconductor block output, and an output connected to the transconductor block output.

24. The terminal according to claim 23, the servocontroller further comprising a second differential current amplifier having inputs connected to the differential transconductor block outputs and output connected to a means for polarizing this transconductor block so as to servocontrol a difference between differential input currents to the current switching block to zero by making a differential control of static output currents from the transconductor block.

25. The terminal according to claim 22, wherein the servocontrollor further operates to servocontrol each input current to the current switching block to a current proportional to the reference current and independent of the static output current from the transconductor block.

26. The terminal according to claim 25, wherein the servocontroller comprises:
   a current source generating the reference current on its output terminal connected to the current switching block input;
   a first differential current amplifier that has a first input connected to the output terminal from the current source, an output connected to a first input to the current switching block and to a first output from the transconductor block, and the output being looped back to a second input of the first amplifier; and
   a second differential current amplifier that has a first input connected to the output terminal from the current source, an output connected to a second input of the current switching block and to a second output from the transconductor block and the output being looped back to a second input of the second amplifier.

27. A direct conversion frequency transposition device, comprising:
- an input;
- a radio frequency stage connected to the input;
- a current switching stage connected to an output; and
- a servocontroller coupled between the radio frequency stage and the current switching stage and operable to servocontrol differential standby output currents of the current switching stage directly to a current proportional to a reference current and independently of standby output currents of the radio frequency stage,
- wherein a difference between differential standby output currents of the current switching stage is servocontrolled to zero by differentially comparing standby output currents of the radio frequency stage.

28. The device of claim 27 wherein the radio frequency stage is a transconductor.

29. The device of claim 27 wherein the standby currents of the radio frequency stage and current switching stage are standby output currents.

30. The device of claim 29 wherein the standby output currents are directly servocontrolled.

31. The device of claim 29 wherein the standby output currents are indirectly servocontrolled.

32. The device of claim 27 wherein the servocontroller operates to servocontrol input current to the current switching stage to a current proportional to a reference current and independent of a standby output current of the radio frequency stage.

33. The device of claim 32 wherein a difference between differential input currents to the current switching stage is servocontrolled to zero by differentially comparing standby output currents of the radio frequency stage.

34. A circuit, comprising:
- a differential transconductance stage including a differential voltage input and a differential current output at a first and second node;
- a differential current switching stage including a differential current input at a third and fourth node and a differential output at a fifth and sixth node; and
- a servocontroller stage coupled between the differential transconduotance stage and the differential current switching stage, the servocontroller stage including a first resistance between the first and third node and a second resistance between the second and fourth node, the servocontroller stage operating to servocontrol currents flowing through the first and second resistances to be proportional to a reference current and independent of the differential current output from the differential transconductance stage.

35. The circuit of claim 34 wherein the servocontroller stage further comprises:
- a first differential amplifier including a first input coupled to the reference current and a second input coupled to an output of the first differential amplifier, the first differential amplifier output being coupled to the first node; and
- a second differential amplifier including a first input coupled to the reference current and a second input coupled to an output of the second differential amplifier, the second differential amplifier output being coupled to the second node.

36. The circuit of claim 35 further comprising a third resistance coupled between the first input of the first differential amplifier and the third node and a fourth resistance coupled between the first input of the second differential amplifier and the fourth node.

37. The circuit of claim 34 wherein the servocontroller stage further comprises:
- a differential amplifier including a first input coupled to the reference current and a second input coupled through third and fourth resistances to the first and second nodes, respectively, and wherein an output of the differential amplifier is coupled through fifth and sixth resistances to the first and second nodes, respectively.

38. The circuit of claim 34 wherein the servocontroller stage further comprises:
- a differential amplifier including a first input coupled to the reference current and a second input coupled through third and fourth resistances to the fifth and sixth nodes, respectively, and wherein an output of the differential amplifier is coupled through fifth and sixth resistances to the first and second nodes, respectively.

* * * * *

UNITED STATES PATENT AND TRADEMARK OFFICE
CERTIFICATE OF CORRECTION

| | | |
|---|---|---|
| PATENT NO. | : 7,280,815 B2 | Page 1 of 1 |
| APPLICATION NO. | : 10/649345 | |
| DATED | : October 9, 2007 | |
| INVENTOR(S) | : Bruno Pellat et al. | |

It is certified that error appears in the above-identified patent and that said Letters Patent is hereby corrected as shown below:

In the Specification:
    At column 6, line number 7, please replace the word [imput] with the word -- input --.

In the Claims:
    At column 8, claim number 4, line number 11, please replace the word [to] with the word -- the --.
    At column 8, claim number 6, line number 26, please replace the word [trsnaconductor] with the word -- transconductor --.
    At column 8, claim number 10, line number 61, please replace the word [transconductdr] with the word -- transconductor --.
    At column 8, claim number 10, line number 63, please replace the word [black] with the word -- block --.
    At column 9, claim number 11, line number 2, please replace the word [front] with the word -- from --.
    At column 9, claim number 17, line number 53, please replace the word [made] with the word -- mode --.
    At column 10, claim number 21, line number 14, please replace the word [polarlaing] with the word -- polarizing -- and please also replace the word [sarvocontrol] with the word -- servocontrol --.
    At column 10, claim number 25, line number 46, please replace the word [servocontrollor] with the word -- servocontroller --.
    At column 11, claim number 34, line numbers 35-36, please replace the word [difterential] with the word -- differential --.
    At column 11, claim number 34, line number 42, please replace the word [transconduotance] with the word -- transconductance --.

Signed and Sealed this
Thirteenth Day of September, 2011

David J. Kappos
*Director of the United States Patent and Trademark Office*